(12) United States Patent
An

(10) Patent No.: US 6,815,227 B2
(45) Date of Patent: Nov. 9, 2004

(54) METHOD OF FABRICATING A FERROELECTRIC MEMORY DEVICE

(75) Inventor: Hyeong-Geun An, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/744,378

(22) Filed: Dec. 22, 2003

(65) Prior Publication Data

US 2004/0137648 A1 Jul. 15, 2004

Related U.S. Application Data

(62) Division of application No. 10/245,004, filed on Sep. 16, 2002, now Pat. No. 6,717,197.

(30) Foreign Application Priority Data

Sep. 21, 2001 (KR) .......................................... 2001-58560

(51) Int. Cl.⁷ .............................................. H01L 21/00
(52) U.S. Cl. ........................................................... 438/3
(58) Field of Search ............................................... 438/3

(56) References Cited

U.S. PATENT DOCUMENTS 5,963,466 A 10/1999 Evans, Jr. .................... 365/145
6,410,344 B1 6/2002 Chung ............................ 438/3

*Primary Examiner*—Van Thu Nguyen
*Assistant Examiner*—Beth E. Owens
(74) *Attorney, Agent, or Firm*—Marger Johnson & McCollom, P.C.

(57) ABSTRACT

A ferroelectric memory device and a method of fabricating the same are provided. The ferroelectric memory device includes at least two capacitor patterns and a plate line. Each of the capacitor patterns includes a lower electrode, a ferroelectric layer, and an upper electrode that are stacked on a semiconductor substrate. A top of the plate line is covered with an oxygen barrier layer, and a sidewall of the plate line is covered with an oxygen barrier spacer.

7 Claims, 7 Drawing Sheets

METHOD OF FABRICATING A FERROELECTRIC MEMORY DEVICE

This application is a divisional of U.S. patent application Ser. No. 10/245,004, filed on Sep. 16, 2002, now U.S. Pat. No. 6,717,197, issued Apr. 6, 2004, which is herein incorporated by reference in their entirety.

TECHNICAL FIELD

This disclosure relates to a ferroelectric memory device such as FRAM and a method of fabricating the same and more specifically, to a ferroelectric memory device having a ferroelectric capacitor and a method of fabricating the same.

BACKGROUND

A ferroelectric material exhibits polarization when an external electric field is applied, and maintains the polarization even after removing the external electric field. Also, the ferroelectric material is a material that makes it possible to control a direction of spontaneous polarization according to a change of the electric field. The ferroelectric material can include, for example, PZT[Pb(Zr, Ti)O$_3$], SBT[SrBi$_2$Ta$_2$O$_9$] and the like. The characteristics of the ferroelectric material may be used for forming binary memory devices. Thus, extensive studies have been made of a ferroelectric memory device such as a ferroelectric random access memory (FRAM).

In order to form the ferroelectric memory device, materials such as PZT, SBT should have a perovskite structure. The method of forming the perovskite structure includes stacking the materials such as PZT, SBT in an amorphous state and then annealing them at an oxidizing ambient of a high temperature, e.g., 700° C., to be crystallized. However, even if the material described method, the ferroelectric memory device still may suffer from drawbacks. For instance, if the ferroelectric memory device gets a physical shock during the subsequent process such as an etching process, or if a material such as hydrogen is diffused into the ferroelectric layer, the ferroelectric layer may suffer from deterioration of characteristics thereof.

FIG. 1 is a cross-sectional view of a cell (region) of a FRAM device for explaining deterioration of the characteristics after patterning of a ferroelectric capacitor. The FRAM device as shown in FIG. 1 has an adjacent pair of memory cells having a single plate line in common.

Referring to FIG. 1, an isolation layer 11 is formed at a semiconductor substrate 10 to define an active region. A gate electrode 15 having a spacer 13 is formed on the semiconductor substrate 10. A first interlayer insulating layer 17 is formed on the gate electrode 15. A bit line contact 19 is formed in the first interlayer insulating layer 17, and a bit line 21 is formed on the bit line contact 19. A second interlayer insulating layer 23 is formed to cover the first interlayer insulating layer 17 and the bit line 21. A contact plug 25 connected to a source of a cell transistor is formed to penetrate the first and second interlayer insulating layers 17 and 23. Thereafter, a titanium adhesion layer, a lower electrode layer, a ferroelectric layer, and an upper electrode layer are sequentially formed to cover the second interlayer insulating layer 23 and the contact plug 25. The titanium adhesion layer, the lower electrode layer, the ferroelectric layer, and the upper electrode layer are patterned to form a capacitor. At this time, the capacitor consists of an adhesion layer pattern 31, a lower electrode 33, a ferroelectric layer pattern 35, and an upper electrode 37. A space between two adjacent capacitors is filled with a third interlayer insulating layer 39. The process of forming the third interlayer insulating layer 39 includes stacking an insulating layer on the second interlayer insulating layer and performing a planarizing etch back with respect to the stacked insulating layer. Next, an aluminum layer is stacked on an entire surface of the substrate where the third interlayer insulating layer is formed. The aluminum layer is patterned to form a plate line 41. The plate line 41 overlaps with portions of the upper electrodes of the two capacitors. Next, a fourth interlayer insulating layer 43 is formed to cover the plate line 41. An interconnection line 45 is formed on the fourth interlayer insulating layer 43.

During the process of forming the plate line 41 as described above, the ferroelectric layer pattern 35 may suffer from deterioration of polarization thereof. As shown in FIG. 1, the plate line 41 has a peripheral region 47 illustrated as a dotted circle. FIG. 2 is a graph showing polarization reduction resulting from deterioration of the characteristics of the ferroelectric layer. When the ferroelectric layer is formed on a capacitor and etched, the characteristic thereof may be deteriorated. In this case, it is ideal that the polarization of the ferroelectric layer should be measured both before and after deterioration. Though, FIG. 2 shows the polarization measured with respect to the recovered ferroelectric layer, instead of the polarization measured before deterioration. This is because the polarization of the recovered ferroelectric layer is no higher than that of the ferroelectric layer that is not yet deteriorated. According to the graph of FIG. 2, the polarization is deteriorated due to an etching process.

Therefore, a recovery annealing should be performed with respect to the ferroelectric capacitor or the ferroelectric layer so as to cure etching damages. The recovery annealing is carried out with respect to an exposed top of the capacitor after the etching process. The recovery annealing is typically carried out in an oxygen ambient of a temperature of about 450° C. However, the aluminum plate line is oxidized during the recovery annealing. In particular, aluminum oxide is formed at a contact area between the aluminum plate line and the upper electrode of the capacitor. As a result, the ferroelectric memory device may suffer another drawback. That is, a resistance between the upper electrode and the plate line may be increased.

Furthermore, in order to fabricate a highly integrated FRAM device, a width or an area of the overlapped portion of the plate line and the upper electrode has been decreased, and a contact resistance has been increased. Accordingly, if an oxide layer is formed at the contact area between the plate line and the upper electrode during the recovery annealing as mentioned above, the contact resistance may be increased even more. As a result, a cell memory device may not operate as effectively as possible.

SUMMARY OF THE INVENTION

Embodiments of the invention overcome the above-mentioned disadvantages of the conventional ferroelectric memory device such as FRAM. These embodiments provide a ferroelectric memory device and a method of fabricating the same, which may prevent deterioration of a ferroelectric characteristic of a ferroelectric layer during an etching process of a plate line. The etching process of the plate line is carried out on top of an upper electrode of a ferroelectric capacitor after formation of the capacitor.

Additionally, embodiments of the invention can prevent an increase in a contact resistance caused by an insulating oxide formed between an upper electrode and a plate line.

DETAILED DESCRIPTION

Figure 1:
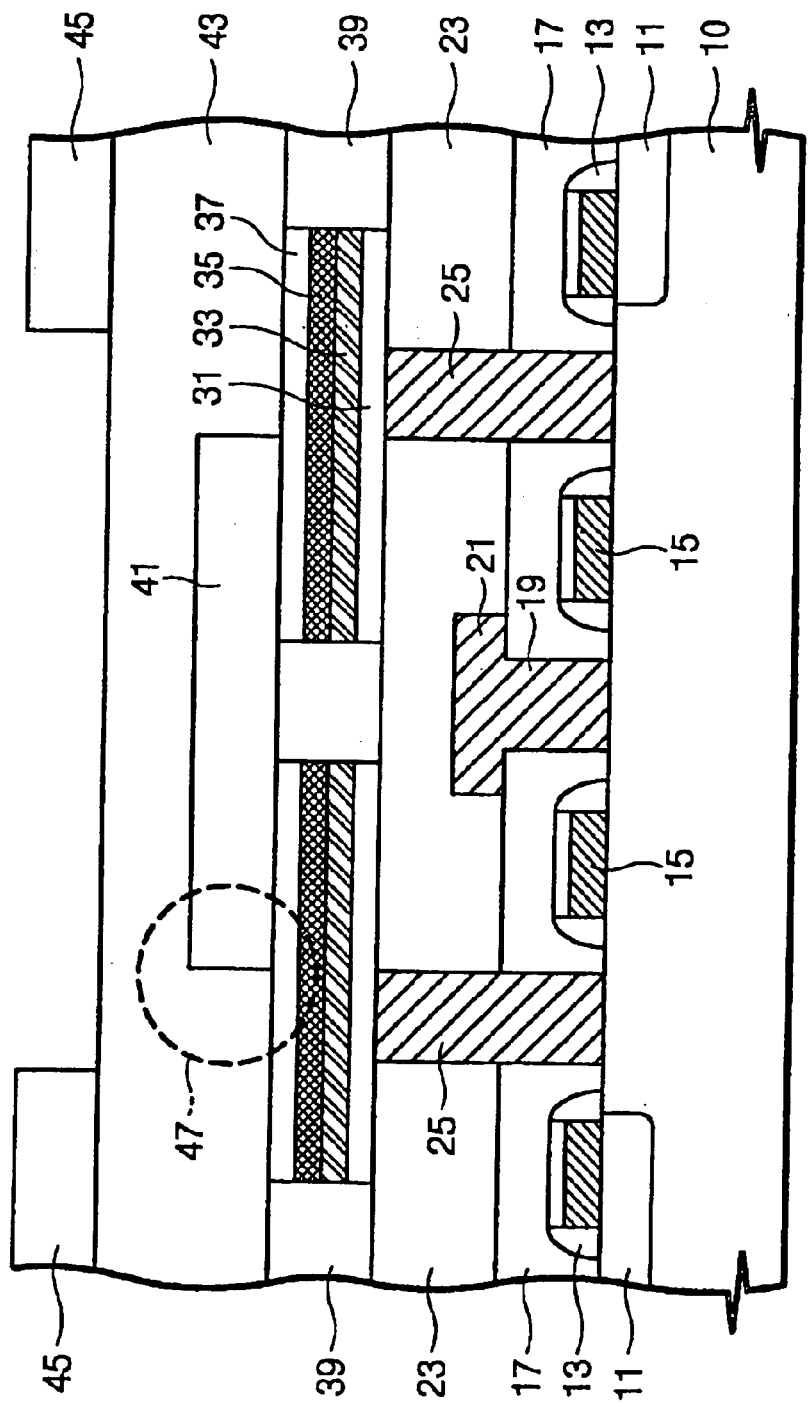
FIG. 1 is a cross-sectional view of a cell (region) of a FRAM device of which an adjacent pair of memory cells has a single plate line in common for explaining deterioration of the characteristics after patterning of a ferroelectric capacitor.
Figure 2:
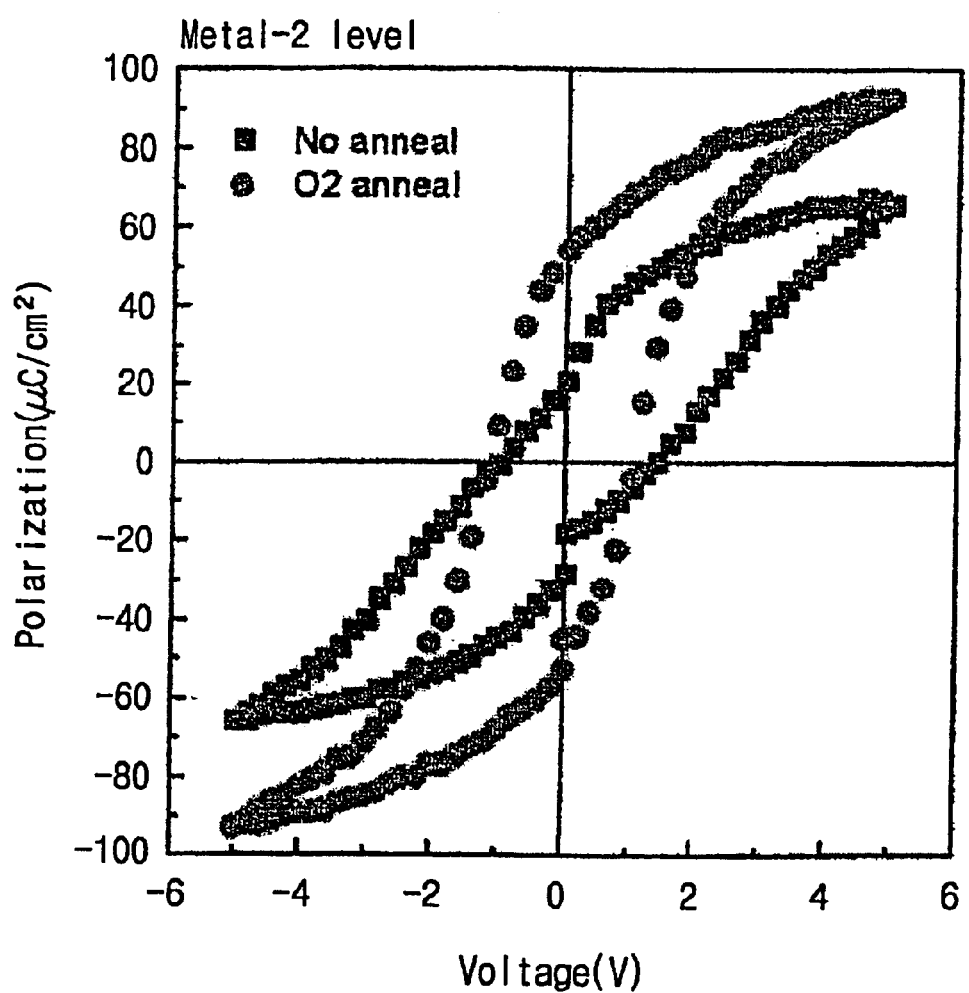
FIG. 2 is a graph showing polarization reduction caused by deterioration of the characteristics of the ferroelectric layer that arises when the ferroelectric layer is formed on a capacitor and etched.

The present invention will now be described more fully hereinafter with reference to the accompanying drawings, in which preferred embodiments of the invention are shown.

FIGS. 3 through 7 are cross-sectional views showing processes of a method of forming a ferroelectric memory device in accordance with embodiments of the present invention.

Although not shown in the drawings, a pre-step process of forming a typical ferroelectric memory device includes forming an isolation layer at a substrate to define an active region. A gate insulating layer and a gate layer are stacked on the substrate where the isolation layer and the active region are formed. The gate insulating layer and the gate layer are patterned to form a gate line. The gate line crosses the substrate including the active region. An ion implantation is performed using the gate line as an ion implantation mask to form a source and a drain of an MOS transistor in the active region. An interlayer insulating layer is stacked on the MOS transistor. A contact hole is formed in the interlayer insulating layer to expose the drain of the MOS transistor. A bit line contact is formed in the contact hole, and a bit line is formed on the bit line contact. Another interlayer insulating layer is stacked on the bit line. A storage node contact hole is formed in the interlayer insulating layer to expose the source of the MOS transistor. A storage node contact plug is formed to fill the node contact hole.

Figure 3:
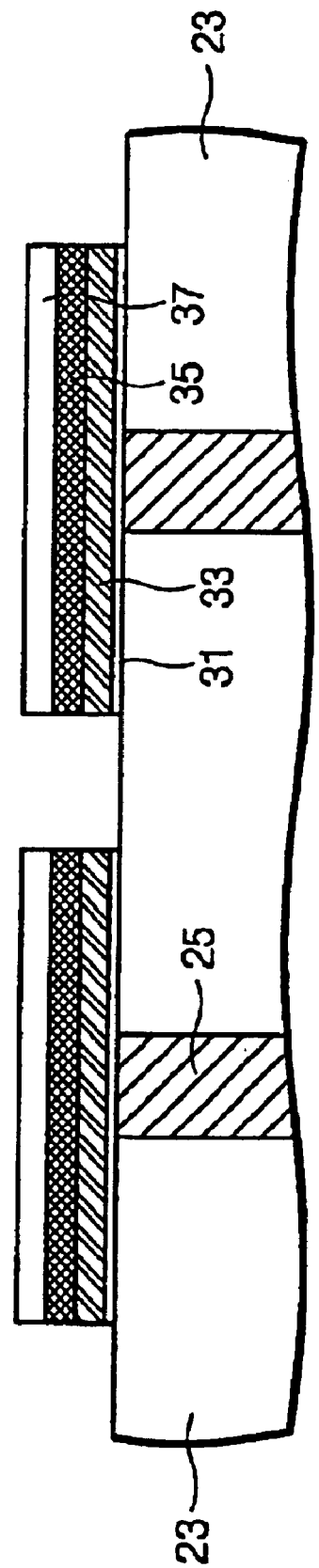
FIGS. 3 through 7 are cross-sectional views showing processes of a method of forming a ferroelectric memory device in accordance with embodiments of the present invention.

Referring to FIG. 3, a storage node contact plug 25, formed according the foregoing typical method, penetrates an interlayer insulating layer 23 to be connected to the substrate (not shown). An adhesive layer pattern 31, a lower electrode 33, a ferroelectric layer pattern 35, and an upper electrode 37 are sequentially stacked on the storage node contact plug 25. In this case, the adhesive layer pattern 31 could be formed of a titanium layer; the lower electrode 33 could be formed of a triple layer of platinum, iridium oxide, and iridium; the ferroelectric layer pattern 35 could be formed of PZT; and the upper electrode 37 could be formed of a double layer of iridium and iridium oxide.

The titanium layer for the adhesive layer is thinly stacked to a thickness of, e.g., 100 angstroms, and typically stacked by sputtering or chemical vapor deposition (CVD). The titanium layer may serve as an oxygen barrier. The platinum layer, the iridium oxide layer, the iridium layer, which constitute the lower electrode 33, are stacked to a thickness of 500, 300, and 500 angstroms, respectively by sputtering. The upper and lower electrode layers may be formed of different material(s) that may maintain conductivity even after an annealing process of a high temperature. For example, the upper and lower electrode layers may be one or more of the noble metals of the platinum group and conductive oxides thereof. The noble metals of the platinum group include platinum, ruthenium, iridium, rhodium, osmium, palladium and the like.

In addition, a ferroelectric material is stacked on the substrate to form the ferroelectric layer by sputtering or sol-gel doping process. The ferroelectric material could be, for instance, PZT[Pb(Zr, Ti)O3], SrTiO3, BaTiO3, BST [(Ba,Sr)TiO3], SBT(SrBi2Ta2O9), (Pb,La)(Zr,Ti)O3, Bi4Ti3O12 and the like. The ferroelectric layer is typically formed to a thickness of 100 angstroms. The ferroelectric material is annealed in an oxygen ambient of a temperature of 700° C. and higher so as to have a perovskite structure. The iridium layer and the iridium oxide layer, which constitute the upper electrode layer 37, are stacked to a thickness of 1000 and 200 angstroms, respectively, for example.

After the upper electrode layer 37 is formed, the adhesive layer 31, the lower electrode layer 33, the ferroelectric layer 35, and the upper electrode layer are sequentially patterned. In this case, a photoresist pattern is typically used as an etch mask so that the foregoing layers may be etched to form a capacitor pattern.

Figure 4:
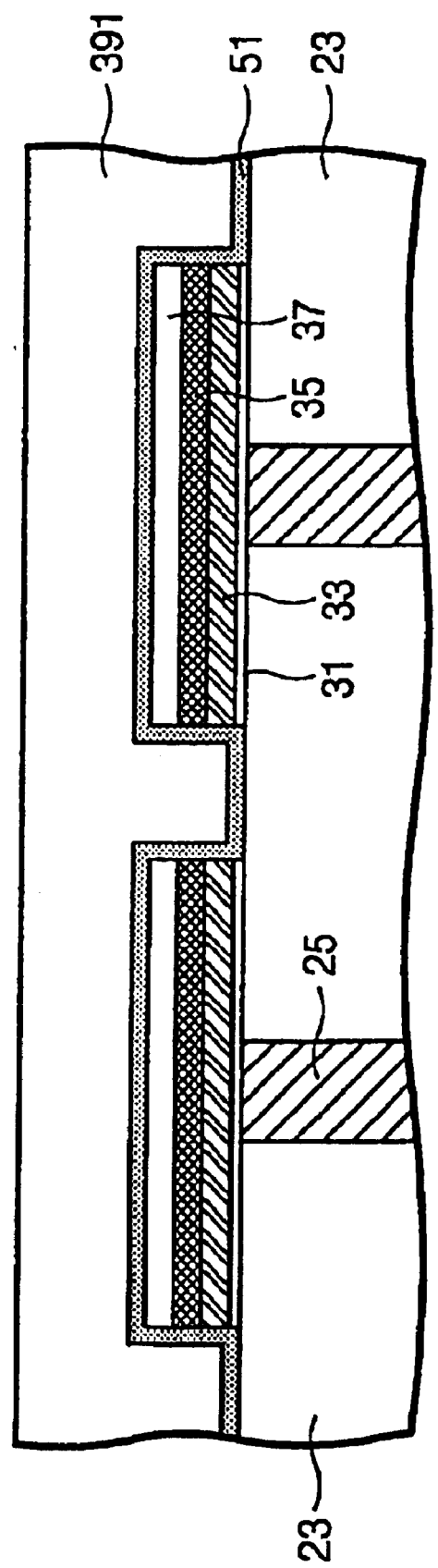

Referring to FIG. 4, an encapsulating barrier layer 51 is formed on the substrate where the capacitor pattern is formed. The encapsulating barrier layer 51 is made of a layer of a metal oxide such as aluminum oxide, titanium oxide, silicon oxide, zirconium oxide, or cesium oxide, and formed to a thickness of, e.g., 100 angstroms. The encapsulating barrier layer 51 may serve as a hydrogen barrier layer.

An interlayer insulating layer 391 is stacked on the encapsulating barrier layer 51. The interlayer insulating layer may be made of, e.g., a silicon oxide layer formed by chemical vapor deposition (CVD) or spin-on-glass (SOG) technique. The interlayer insulating layer 391 should be formed to a thickness enough to fill a space between the capacitor patterns. Also, a top of the interlayer insulating layer is preferably planarized.

Figure 5:
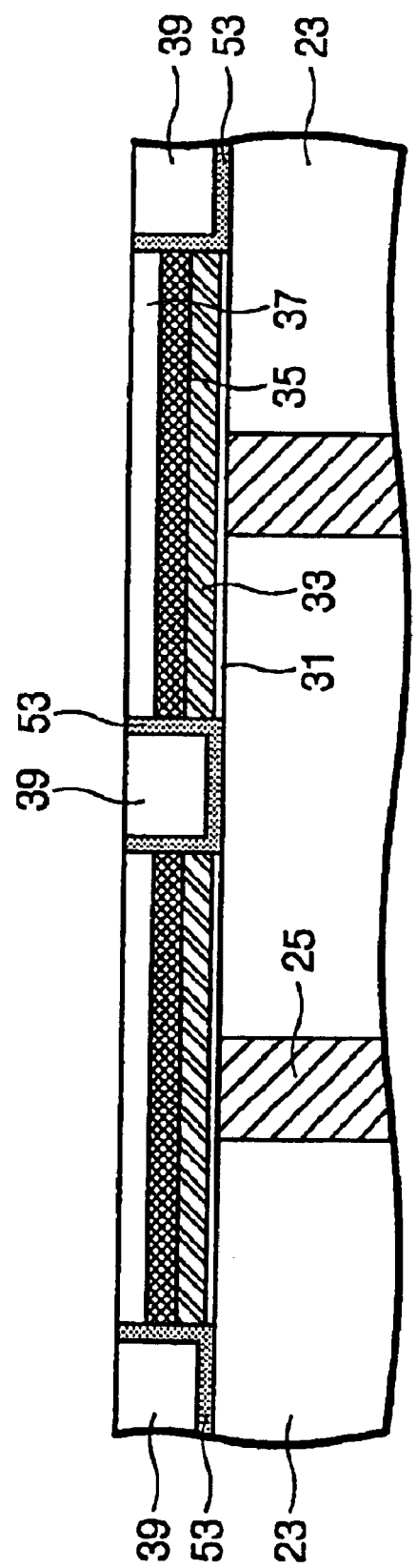

Referring to FIG. 5, portions of the encapsulating barrier layer 51 and the interlayer insulating layer 391 (shown in FIG. 4) are removed to form an insulating layer pattern that includes an encapsulating barrier layer pattern 53 and an interlayer insulating layer pattern 39. The removal process is performed by etch back or chemical mechanical polishing (CMP), e.g. The removal process is performed until a top of the upper electrode 37 of the capacitor pattern is exposed.

Figure 6:
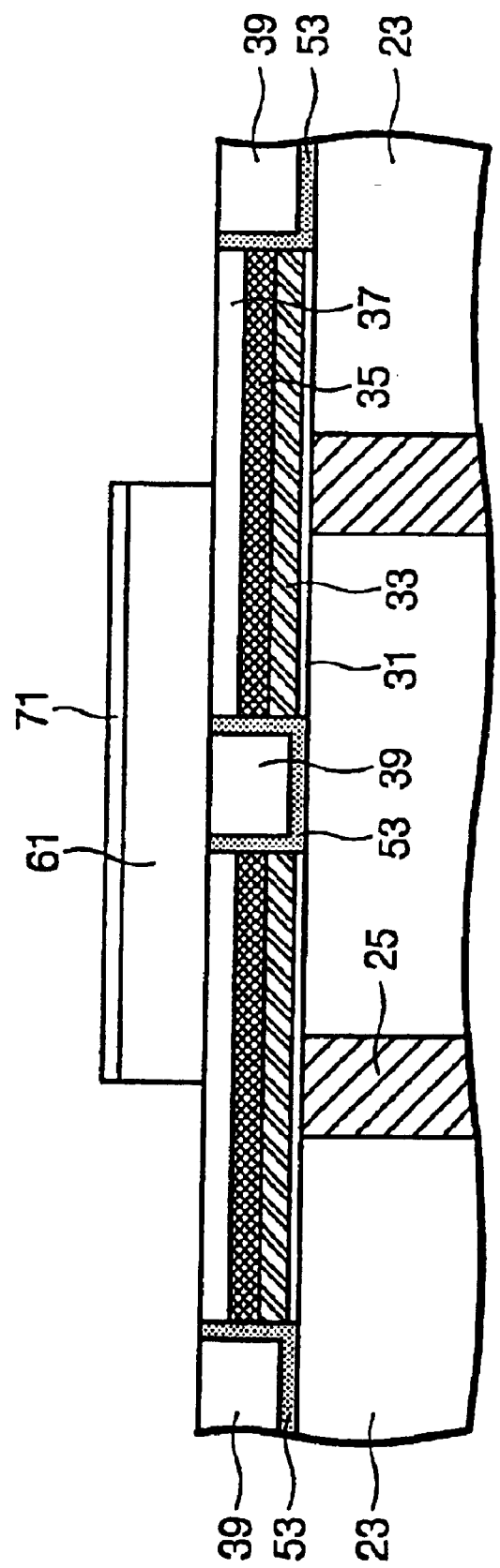

Referring to FIG. 6, a metal layer 61 is stacked on the substrate where the top of the upper electrode 37 is exposed. Additionally, a titanium nitride layer is thinly stacked as an oxygen barrier layer 71 on the metal layer. The metal layer 61 is typically made of an aluminum layer, and other oxygen barrier layers 71 may be used instead of the titanium nitride layer. Typically, the metal layer 61 or the titanium nitride layer may be formed by sputtering. Since the titanium nitride layer may also be used as an anti-reflecting layer, the titanium nitride layer is more advantageous as compared to other oxygen layers.

The metal layer and the titanium nitride layer are patterned to form a plate line that includes a metal layer pattern 61 and a titanium nitride layer pattern 71. The plate line is formed to be in contact with tops of the exposed upper electrodes 37 of an adjacent pair of capacitor patterns. Preferably, an adjacent pair of capacitor patterns is arranged with bilateral symmetry with respect to a central line of the plate line in a cross-sectional view taken vertically to a longitudinal direction of the plate line. One portion of the top of the upper electrode 37 of the capacitor is covered with the metal layer pattern 61, and the other portion thereof is still exposed.

Figure 7:
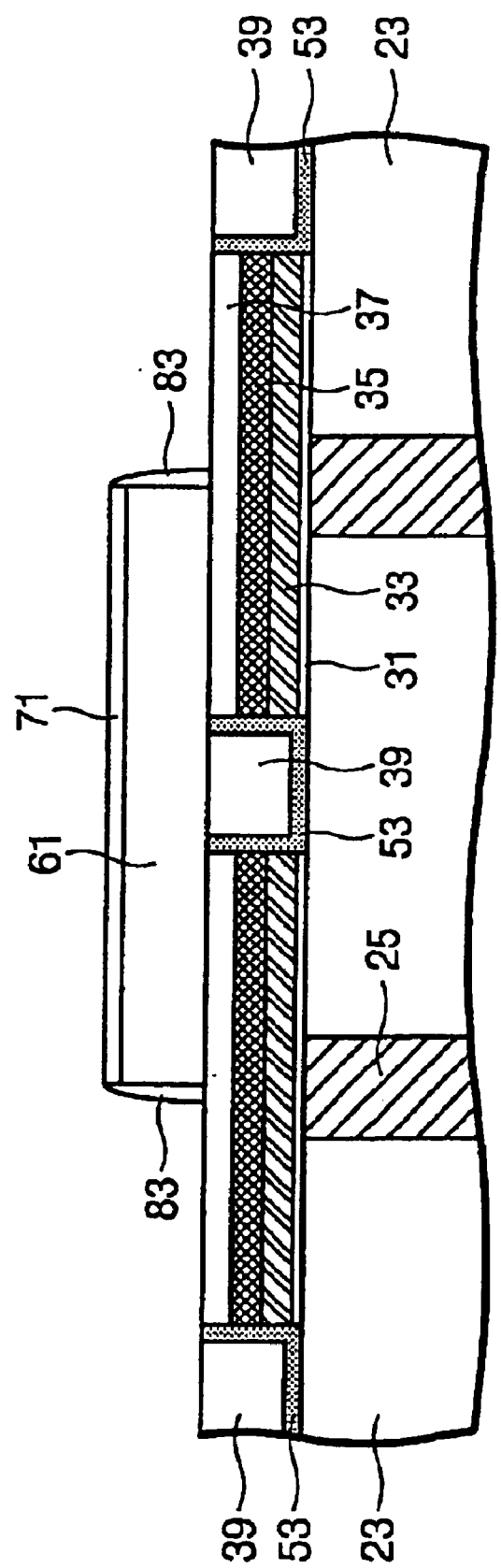

Referring to FIG. 7, a thin oxygen barrier layer such as, for instance, an aluminum oxide layer is stacked on the entire surface of the substrate where the metal layer pattern 61 is covered with the titanium nitride layer pattern 71. Instead of aluminum oxide, the oxygen barrier layer may alternatively be composed of titanium oxide, tantalum oxide, silicon oxide, cesium oxide, zirconium oxide, or silicon nitride. By an isotropic dry etch process, the aluminum oxide layer remains only on a sidewall of the metal layer pattern to form spacers 83. The spacers 83 are formed to leave a portion of the upper electrode 37 exposed.

As shown in FIG. 7, the top of the metal layer pattern 61 is covered with the titanium nitride pattern 71, and the sidewall of the metal layer pattern 61 is covered with the aluminum oxide spacer 83. Accordingly, when the ferroelectric layer 35 of the capacitor will be annealed at a temperature of 450° C. for restoring the ferroelectric characteristic during the subsequent process, it is possible to prevent oxidization of a surface of the metal layer pattern 61. That is, the titanium nitride pattern 71 and the aluminum oxide spacer 83 may serve as the oxygen barriers for preventing oxidization of the metal layer pattern 61. As a result, oxygen is prevented from penetrating between the upper electrode 37 and the metal layer pattern 61, and, likewise, an insulating oxide layer formed at an interface therebetween is also prevented. Hence, an elevated contact resistance between the upper electrode 37 and the metal layer pattern 61 due to the interposed insulating oxide layer is prevented. Meanwhile, since a portion of the upper electrode 37 remains exposed, oxygen may be diffused into the exposed portion. Therefore, the ferroelectric layer 35 can be effectively annealed for restoring the ferroelectric characteristic. In this case, the iridium layer constituting the upper electrode 37 has not only a considerably dense structure but also a columnar structure. Accordingly, oxygen may be relatively easily diffused into the upper electrode 37 in a columnar direction along crystal grain boundaries of the iridium layer. In other words, oxygen may be easily diffused into the iridium layer in the columnar direction to cure damages during the annealing process. However, because oxygen is not easily diffused in the horizontal direction, the aluminum oxide layer is effectively prevented from being formed at an interface between the aluminum plate line and the upper electrode.

According to embodiments of the present invention as described above, an oxygen barrier spacer is formed on a sidewall of a plate line that is formed on top of a capacitor. As a result, oxidation of the plate line is prevented during a subsequent recovery annealing. Hence, a contact resistance between an upper electrode of the capacitor and the plate line may be minimized.

According to embodiments of the present invention, a ferroelectric memory device includes at least two capacitor patterns and a plate line. Each of the capacitor patterns includes a lower electrode, a ferroelectric layer, and an upper electrode. The lower electrode, the ferroelectric layer, and the upper electrode are stacked on a semiconductor substrate. At least a sidewall of the lower electrode is covered with an insulating layer. The plate line is formed on the capacitor patterns such that the plate line overlaps with portions of the upper electrodes of the capacitor patterns. A top of the plate line is covered with an oxygen barrier layer, and a sidewall of the plate line is covered with an oxygen barrier spacer.

A sidewall of the ferroelectric layer of the capacitor pattern also may be covered with an insulating layer. The insulating layer covering the lower electrode or the sidewall of the ferroelectric layer may exhibit an oxygen barrier characteristic or a hydrogen barrier characteristic.

In embodiments of the present invention, a space between the capacitor patterns is preferably filled with an insulating layer to planarize the plate line.

Generally, the upper and lower electrode layers are composed of a layer that is capable of maintaining conductivity even after an annealing process of a high temperature. For example, the upper and lower electrode layers may be composed of a material selected from noble metals of the platinum group and conductive oxides thereof. The noble metals include platinum, ruthenium, iridium, rhodium, osmium, palladium and the like. In addition, a ferroelectric material such as PZT or BST is stacked on the substrate to form the ferroelectric layer by sputtering, chemical vapor deposition (CVD), sol-gel doping process, or atomic layer deposition (ALD).

Also, the plate line is typically composed of an aluminum layer. The aluminum layer is advantageous because the aluminum layer is highly conductive and easily patterned. Though, the oxygen barrier layer constituting the top of the plate line is preferably composed of a titanium nitride layer. This is because the titanium nitride layer may serve both as the oxygen barrier and as an anti-reflecting layer. The plate line is formed in a middle region of the two capacitor patterns to overlap with the two capacitor patterns. Thus, a pair of capacitor patterns is preferably arranged with bilateral symmetry with respect to a central line of the plate line.

According to embodiments of the present invention, a method of forming a ferroelectric memory device includes forming capacitor patterns on a substrate where an interlayer insulating layer is formed. Each of the capacitor patterns includes a lower electrode, a ferroelectric layer, and an upper electrode that are stacked on the interlayer insulating layer. The capacitor patterns are connected to a contact plug that penetrates the interlayer insulating layer. An insulating layer pattern is formed not only to cover at least a sidewall of the lower electrode of the respective capacitor patterns, but also to expose a top of the upper electrode. Next, a conductive layer and an oxygen barrier layer are sequentially formed on the capacitor patterns. The conductive layer and the oxygen barrier layer are patterned to form a plate line. The plate line is formed to overlap with and also be in contact with portions of the upper electrodes of an adjacent pair of capacitor patterns. An oxygen barrier spacer is formed on a sidewall of the plate line. Thereafter, a recovery annealing is performed with respect to the substrate having the plate line.

In the present invention, the process of forming the insulating layer pattern covering at least a sidewall of the lower electrode of the respective capacitor patterns includes conformally stacking an encapsulating barrier layer on the substrate where the capacitor pattern is formed. Thereafter, an interlayer insulating layer such as an oxide layer is stacked on the encapsulating barrier layer to fill a space between the capacitor patterns. Next, the interlayer insulating layer and the encapsulating barrier layer are etched to expose a top of the capacitor pattern or a top of the upper electrode. Though, even after the etching process, the sidewall of the lower electrode remains covered with the encapsulating barrier layer. In this case, the encapsulating barrier layer preferably serves as an oxygen barrier layer or a hydrogen barrier layer. Considering that the lower electrode is formed on the interlayer insulating layer, and that the sidewall of the lower electrode is covered with the encapsulating barrier layer, the interlayer insulating layer may be a conductive layer or an insulating layer. However, the interlayer insulating layer is preferably composed of a CVD silicon oxide layer or an SOG silicon oxide layer. In addition, the interlayer insulating layer and the encapsulating barrier layer are preferably etched by a planarizing process such as chemical mechanical polishing (CMP).

After forming the oxygen barrier spacer on the sidewall of the plate line, as described above, the recovery annealing is preferably performed in an oxygen ambient of a temperature ranging from 450° C. to 700° C.

What is claimed is:

1. A method for forming a ferroelectric memory device comprising:

forming at least two capacitor structures, each of which includes a lower electrode, a ferroelectric layer, and an upper electrode, the structures stacked on a semiconductor substrate, the lower electrode of each of which is connected to a contact plug that penetrates an interlayer insulating layer formed on the substrate;

forming an insulating layer pattern covering at least a sidewall of the lower electrode of the structures;

exposing a top of the upper electrode;

sequentially forming a conductive layer and an oxygen barrier layer on the capacitor structures;

patterning the conductive layer and the oxygen barrier layer to form a plate line such that the plate line overlaps with and contacts portions of the upper electrodes of an adjacent pair of capacitor patterns;

forming an oxygen barrier spacer on a sidewall of the plate line; and performing a recovery annealing with respect to the substrate having the plate line where the oxygen barrier spacer is formed.

2. The method of claim 1, wherein the oxygen barrier layer is formed of a material selected from the group consisting essentially of aluminum oxide, titanium oxide, tantalum oxide, silicon oxide, cesium oxide, zirconium oxide, and silicon nitride.

3. The method of claim 1, wherein forming an insulating layer pattern comprises:

conformally stacking an encapsulating barrier layer on the substrate where the capacitor structures are formed;

stacking an interlayer insulating layer on the encapsulating barrier layer to fill a space between the capacitor structures; and etching the interlayer insulating layer and the encapsulating barrier layer to expose a top of the capacitor structures such that the sidewall of the lower electrode remains covered with the encapsulating barrier layer.

4. The method of claim 3, wherein the encapsulating barrier layer is a hydrogen barrier layer.

5. The method of claim 3, wherein the interlayer insulating layer comprises a silicon oxide layer formed by chemical vapor deposition (CVD) or spin-on-glass (SOG) technique.

6. The method of claim 3, wherein etching the interlayer insulating layer and the encapsulating barrier layer comprises planarizing by chemical mechanical polishing (CMP) or etching back.

7. The method of claim 1, wherein the recovery annealing is performed in an oxygen ambient of a temperature ranging from about 450° C. to 700° C.

* * * * *